United States Patent
Gendler et al.

(10) Patent No.: US 8,826,107 B2
(45) Date of Patent: Sep. 2, 2014

(54) EFFICIENT CACHE SEARCH AND ERROR DETECTION

(71) Applicants: Alexander Gendler, Kiriat Motzkin (IL); Arkady Bramnik, Kiryat Motzkin (IL)

(72) Inventors: Alexander Gendler, Kiriat Motzkin (IL); Arkady Bramnik, Kiryat Motzkin (IL)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 13/729,561

(22) Filed: Dec. 28, 2012

(65) Prior Publication Data

US 2014/0189472 A1    Jul. 3, 2014

(51) Int. Cl.
*H03M 13/00* (2006.01)

(52) U.S. Cl.
USPC .......................................... 714/777; 711/113

(58) Field of Classification Search
CPC ............ G06F 11/1064; G06F 12/0855; G06F 12/0848; G06F 12/0859
USPC .......................................... 714/777; 711/113
See application file for complete search history.

(56) References Cited

U.S. PATENT DOCUMENTS

| | | | | |
|---|---|---|---|---|
| 5,355,478 | A | * | 10/1994 | Brady et al. .......................... 1/1 |
| 5,696,937 | A | * | 12/1997 | White et al. .................. 711/142 |
| 5,845,324 | A | * | 12/1998 | White et al. .................. 711/128 |
| 6,539,503 | B1 | * | 3/2003 | Walker .......................... 714/703 |
| 2005/0289295 | A1 | * | 12/2005 | Shoham et al. ............... 711/108 |
| 2011/0161783 | A1 | * | 6/2011 | Somasekhar et al. ......... 714/768 |
| 2012/0246543 | A1 | | 9/2012 | Szapiro et al. |

* cited by examiner

*Primary Examiner* — David Ton
(74) *Attorney, Agent, or Firm* — Kenyon & Kenyon LLP

(57) ABSTRACT

A first codeword may be constructed from a cache tag in a cache and an error correction code corresponding to the cache tag. A second codeword may be constructed from a search tag and an error correction code corresponding to the search tag. A hamming distance may be calculated between the first codeword and the second codeword. If the hamming distance is less than or equal to a threshold, a cache hit may be signaled. If the hamming distance is above the threshold, a cache miss may be signaled.

20 Claims, 6 Drawing Sheets

500

600

EFFICIENT CACHE SEARCH AND ERROR DETECTION

FIELD OF THE INVENTION

The present disclosure pertains to the field of processors and, in particular, to optimizing cache/storage management techniques.

DESCRIPTION OF RELATED ART

Advances in semi-conductor processing and logic design have permitted an increase in the amount of logic that may be present on integrated circuit devices. As a result, computer system configurations have evolved from a single or multiple integrated circuits in a system to multiple cores, multiple hardware threads, and multiple logical processors present on individual integrated circuits. A processor or integrated circuit typically comprises a single physical processor die, where the processor die may include any number of cores, hardware threads, or logical processors. The ever increasing number of processing elements—cores, hardware threads, and logical processors—on integrated circuits enables more tasks to be accomplished in parallel. However, the execution of more threads and tasks put an increased premium on shared resources, such as memory/cache and the management thereof.

In traditional cache architectures, error detection and correction are performed on cache tags during cache lookups to ensure that the correct requested data is retrieved from the cache. However, traditional error detection and correction techniques may be inefficient because they add performance costs to the cache lookups.

DESCRIPTION OF THE FIGURES

Embodiments are illustrated by way of example and not limitation in the Figures of the accompanying drawings.

DETAILED DESCRIPTION

In the following description, numerous specific details are set forth such as examples of specific hardware structures for storing/caching data, as well as placement of such hardware structures; specific processor units/logic, specific examples of processing elements, etc. in order to provide a thorough understanding of the present invention. It will be apparent, however, to one skilled in the art that these specific details need not be employed to practice the present invention. In other instances, well known components or methods, such as specific counter circuits, alternative multi-core and multi-threaded processor architectures, specific uncore logic, specific memory controller logic, specific cache implementations, specific cache coherency protocols, specific cache algorithms, and specific operational details of microprocessors, have not been described in detail in order to avoid unnecessarily obscuring the present invention.

Embodiments may be discussed herein which efficiently detect and/or correct errors during cache lookups. In an embodiment, a first codeword may be constructed from a cache tag in a cache and an error correction code corresponding to the cache tag. A second codeword may be constructed from a search tag and an error correction code corresponding to the search tag. A hamming distance may be calculated between the first codeword and the second codeword. If the hamming distance is less than or equal to a threshold, a cache hit may be signaled. If the hamming distance is above the threshold, a cache miss may be signaled.

In an embodiment, the threshold may be calculated from a minimum hamming distance. In an embodiment, the minimum hamming distance may be four and the threshold may be two. In an embodiment, responsive to a cache hit, a cache entry corresponding to the search tag may be accessed from the cache. In an embodiment, responsive to a cache miss, a cache entry corresponding to the search tag may be loaded from a higher level cache and/or memory. In an embodiment, responsive to eviction of a cache entry corresponding to the cache tag, one or more errors in the cache tag may be detected. If the detected errors are not correctable, an error condition may be signaled. In an embodiment, the evicted cache entry may be in a modified state.

Figure 1:
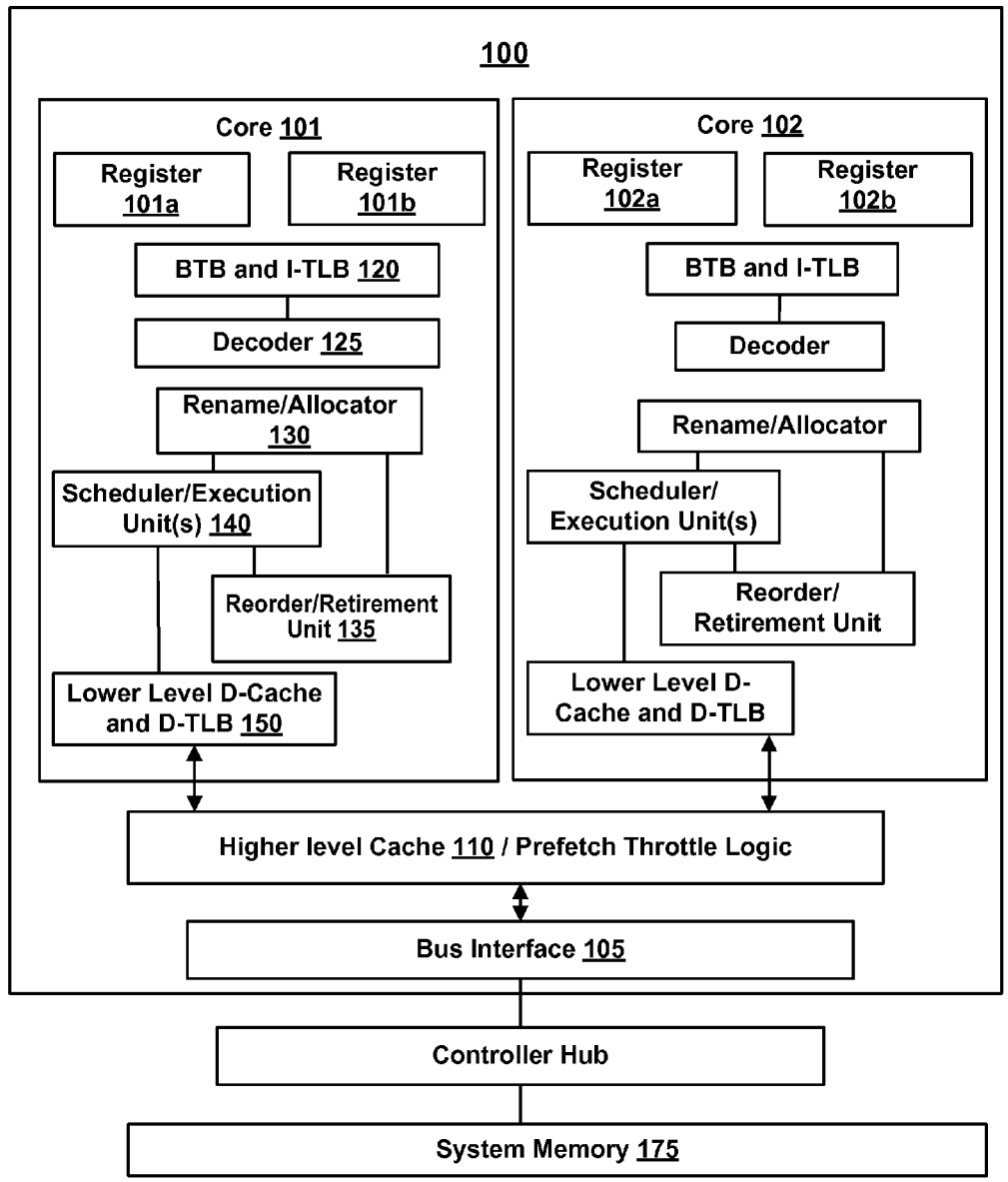
FIG. 1 illustrates a processor including multiple processing elements according to an embodiment.

Referring to FIG. 1, an embodiment of a processor including multiple cores is illustrated. Processor 100, in one embodiment, includes one or more caches. Processor 100 includes any processor, such as a micro-processor, an embedded processor, a digital signal processor (DSP), a network processor, or other device to execute code. Processor 100, as illustrated, includes a plurality of processing elements.

In one embodiment, a processing element refers to a thread unit, a thread slot, a process unit, a context, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor typically refers to an integrated circuit, which potentially includes any number of other processing elements, such as cores or hardware threads.

A core often refers to logic located on an integrated circuit capable of maintaining an independent architectural state wherein each independently maintained architectural state is associated with at least some dedicated execution resources. In contrast to cores, a hardware thread typically refers to any logic located on an integrated circuit capable of maintaining an independent architectural state wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 100, as illustrated in FIG. 1, includes two cores, core 101 and 102. Here, core hopping may be utilized to alleviate thermal conditions on one part of a processor. However, hopping from core 101 to 102 may potentially create the same thermal conditions on core 102 that existed on core 101, while incurring the cost of a core hop. Therefore, in one embodiment, processor 100 includes any number of cores that may utilize core hopping. Furthermore, power management hardware included in processor 100 may be capable of placing individual units and/or cores into low power states to save power. Here, in one embodiment, processor 100 provides hardware to assist in low power state selection for these individual units and/or cores.

Although processor 100 may include asymmetric cores, i.e. cores with different configurations, functional units, and/or logic, symmetric cores are illustrated. As a result, core 102, which is illustrated as identical to core 101, will not be discussed in detail to avoid repetitive discussion. In addition, core 101 includes two hardware threads 101a and 101b, while core 102 includes two hardware threads 102a and 102b. Therefore, software entities, such as an operating system, potentially view processor 100 as four separate processors, i.e. four logical processors or processing elements capable of executing four software threads concurrently.

Here, a first thread is associated with architecture state registers 101a, a second thread is associated with architecture state registers 101b, a third thread is associated with architecture state registers 102a, and a fourth thread is associated with architecture state registers 102b. As illustrated, architecture state registers 101a are replicated in architecture state registers 101b, so individual architecture states/contexts are capable of being stored for logical processor 101a and logical processor 101b. Other smaller resources, such as instruction pointers and renaming logic in rename allocater logic 130 may also be replicated for threads 101a and 101b. Some resources, such as re-order buffers in reorder/retirement unit 135, ILTB 120, load/store buffers, and queues may be shared through partitioning. Other resources, such as general purpose internal registers, page-table base register, low level data-cache and data-TLB 115, execution unit(s) 140, and portions of out-of-order unit 135 are potentially fully shared.

Processor 100 often includes other resources, which may be fully shared, shared through partitioning, or dedicated by/to processing elements. In FIG. 1, an embodiment of a purely exemplary processor with illustrative logical units/resources of a processor is illustrated. Note that a processor may include, or omit, any of these functional units, as well as include any other known functional units, logic, or firmware not depicted. As illustrated, processor 100 includes a branch target buffer 120 to predict branches to be executed/taken and an instruction-translation buffer (I-TLB) 120 to store address translation entries for instructions.

Processor 100 further includes decode module 125 is coupled to fetch unit 120 to decode fetched elements. In one embodiment, processor 100 is associated with an Instruction Set Architecture (ISA), which defines/specifies instructions executable on processor 100. Here, often machine code instructions recognized by the ISA include a portion of the instruction referred to as an opcode, which references/specifies an instruction or operation to be performed.

In one example, allocator and renamer block 130 includes an allocator to reserve resources, such as register files to store instruction processing results. However, threads 101a and 101b are potentially capable of out-of-order execution, where allocator and renamer block 130 also reserves other resources, such as reorder buffers to track instruction results. Unit 130 may also include a register renamer to rename program/instruction reference registers to other registers internal to processor 100. Reorder/retirement unit 135 includes components, such as the reorder buffers mentioned above, load buffers, and store buffers, to support out-of-order execution and later in-order retirement of instructions executed out-of-order.

Scheduler and execution unit(s) block 140, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 150 are coupled to execution unit(s) 140. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

As depicted, cores 101 and 102 share access to higher-level or further-out cache 110, which is to cache recently fetched elements. Note that higher-level or further-out refers to cache levels increasing or getting further way from the execution unit(s). In one embodiment, higher-level cache 110 is a last-level data cache—last cache in the memory hierarchy on processor 100—such as a second or third level data cache. However, higher level cache 110 is not so limited, as it may be associated with or include an instruction cache. A trace cache—a type of instruction cache—instead may be coupled after decoder 125 to store recently decoded traces.

Note, in the depicted configuration that processor 100 also includes bus interface module 105 to communicate with devices external to processor 100, such as system memory 175, a chipset, a northbridge, or other integrated circuit. Memory 175 may be dedicated to processor 100 or shared with other devices in a system. Common examples of types of memory 175 include dynamic random access memory (DRAM), static RAM (SRAM), non-volatile memory (NV memory), and other known storage devices.

Figure 2:
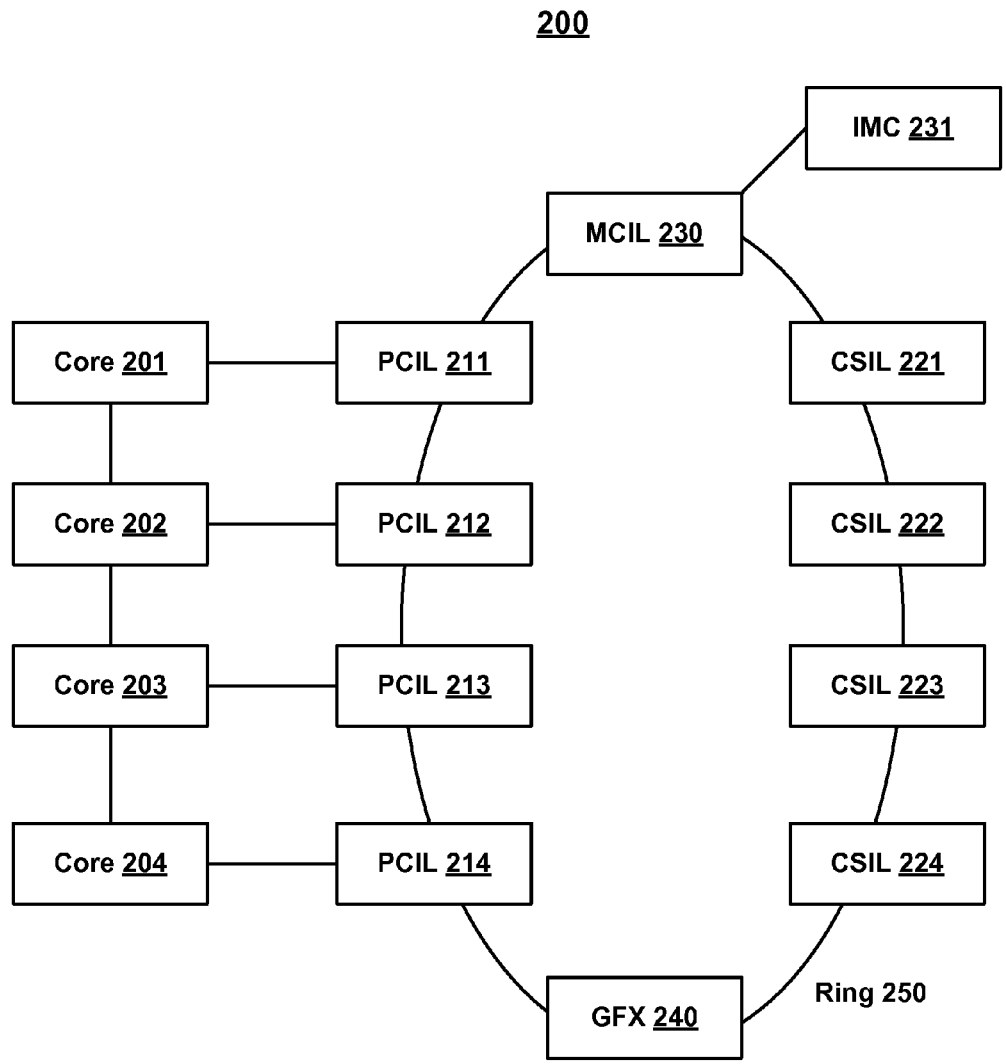
FIG. 2 illustrates on-core memory interface logic according to an embodiment.

FIG. 1 illustrates an abstracted, logical view of an exemplary processor with a representation of different modules, units, and/or logic. However, note that a processor utilizing the methods and apparatus' described herein need not include the illustrated units. And, the processor may omit some or all of the units shown. To illustrate the potential for a different configuration, the discussion now turns to FIG. 2, which depicts an embodiment of processor 200 including an on-processor memory interface module—an uncore module—with a ring configuration to interconnect multiple cores. Processor 200 is illustrated including a physically distributed cache; a ring interconnect; as well as core, cache, and memory controller components. However, this depiction is purely illustrative, as a processor implementing the described methods and apparatus may include any processing elements, style or level of cache, and/or memory, front-side-bus or other interface to communicate with external devices.

In one embodiment, caching agents 221-224 are each to manage a slice of a physically distributed cache. As an example, each cache component, such as component 221, is to manage a slice of a cache for a co-located core—a core the cache agent is associated with for purpose of managing the distributed slice of the cache. As depicted, cache agents 221-224 are referred to as Cache Slice Interface Logic (CSIL)s; they may also be referred to as cache components, agents, or other known logic, units, or modules for interfacing with a cache or slice thereof. Note that the cache may be any level of cache; yet, for this exemplary embodiment, discussion focuses on a last-level cache (LLC) shared by cores 201-204.

Much like cache agents handle traffic on ring interconnect 250 and interface with cache slices, core agents/components 211-214 are to handle traffic and interface with cores 201-204, respectively. As depicted, core agents 221-224 are referred to as Processor Core Interface Logic (PCIL)s; they may also be referred to as core components, agents, or other known logic, units, or modules for interfacing with a processing element Additionally, ring 250 is shown as including Memory Controller Interface Logic (MCIL) 230 and Graphics Hub (GFX) 240 to interface with other modules, such as memory controller (IMC) 231 and a graphics processor (not illustrated). However, ring 250 may include or omit any of the aforementioned modules, as well as include other known processor modules that are not illustrated. Additionally, similar modules may be connected through other known interconnects, such as a point-to-point interconnect or a multi-drop interconnect.

It's important to note that the methods and apparatus' described herein may be implemented in any cache at any cache level, or at any processor or processor level. Furthermore, caches may be organized in any fashion, such as being a physically or logically, centralized or distributed cache.

Items of data or instructions are typically stored in the cache along with their associated system memory address. If a computer processor requires a particular data or instruction, the processor identifies it through its system memory address. The cache is then searched for the data/instruction item by searching through the addresses of the items stored within the cache. If the address of a stored item matches the address of the requested item, the cache is understood to include the needed item ("a hit"). The item may then be delivered to the processor from the cache thereby avoiding the additional delay associated with accesses made to the system memory.

Caches are typically partitioned according to the addresses of the data/instruction items that may be stored (and searched for) in the cache. In a particular approach, the cache may be divided into sets where each set has a plurality of storage locations referred to as ways. According to a cache search approach, a particular address that is presented to the cache for searching (a "search address") may include both a set component and a tag component. For the given search address, an appropriate set may be identified based on the search address's set component. The tag component of the search address may them be compared against the respective tag components of the addresses of the cached items within the ways of the set. A match corresponds to a cache hit.

Figure 3:
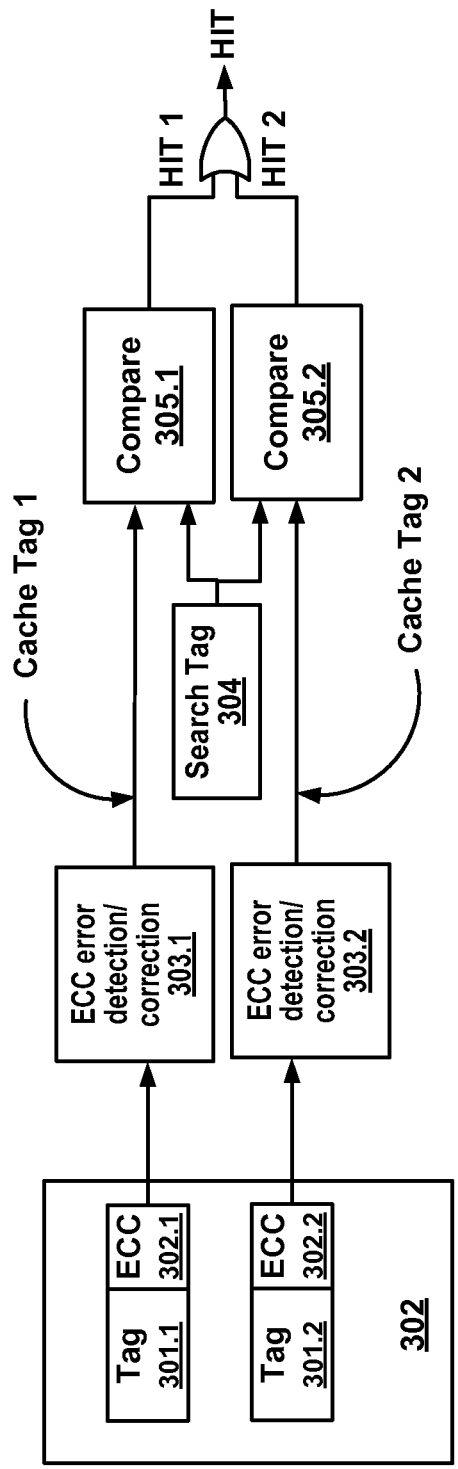
FIG. 3 illustrates a conventional circuit to perform a cache search.

FIG. 3 illustrates a conventional circuit to perform a cache search. The respective tag components 301.1, 301.2 of items cached in the respective ways of the set 302 may be stored along with their own associated error correction codes (ECC) 302.1, 302.2. According to an operation of the circuit of FIG. 3, the tags of two cached items and their associated ECC codes may be read from the cache substantially simultaneously. ECC checking and correction circuitry 303.1, 303.2 may generate a second ECC for each tag, and if the newly generated ECC is different from the stored ECC of the respective tag, an error in the tag value may be flagged and corrected.

The correct tags may then be compared against the tag component 304 of the search address by respective comparison circuits 305.1, 305.2. A match found by either of the comparison circuits corresponds to a cache hit.

Figure 4:
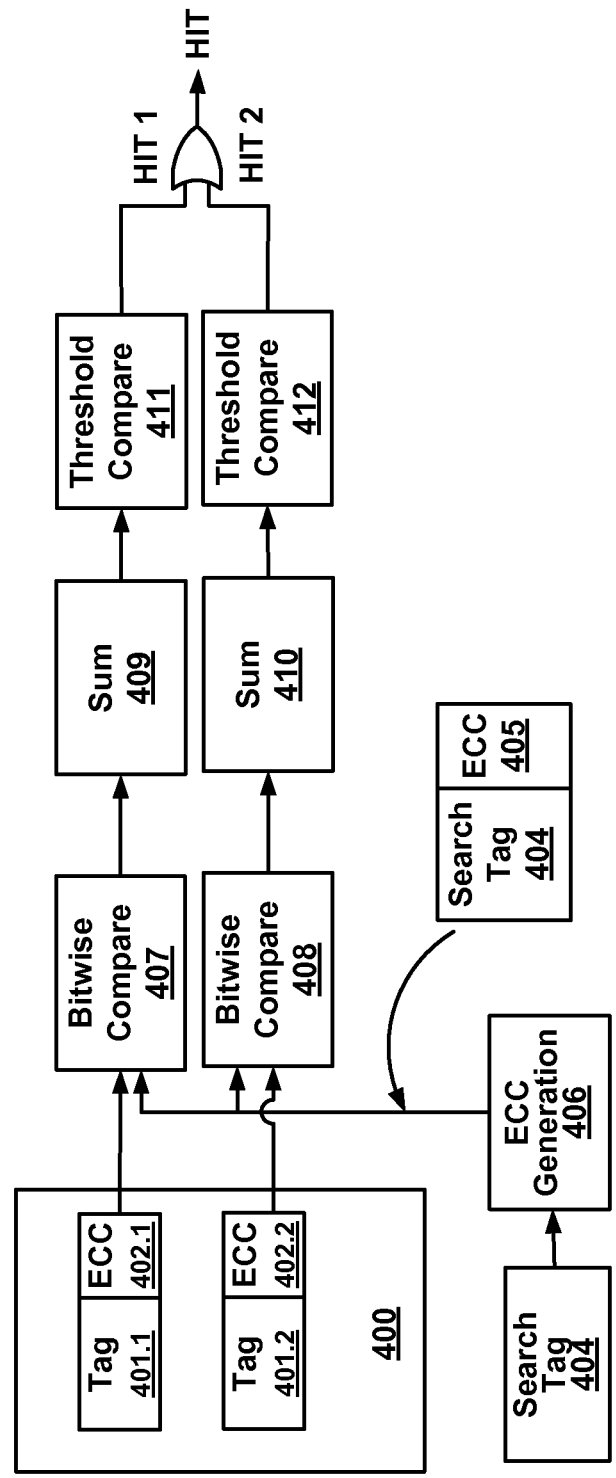
FIG. 4 illustrates a circuit to perform a cache search according to an embodiment.

FIG. 4 illustrates an exemplary circuit to perform a cache search according to an embodiment. In an embodiment, the cache search may be performed without checking for corruption of the cached tags prior to their comparison with the search tag. By avoiding the error checking and correction procedure between the read of the cached tag and its comparison with the search tag, the performance of the cache search process may be improved. Noticeably, although the error checking and correction may not be performed before the comparison, the ECC information is nevertheless utilized.

Specifically, rather than use a cached tag's ECC to identify and correct errors in the cached tags, the Hamming distance is determined between a first data structure including a cached tag and its ECC and a second data structure including the search tag and its ECC. A cache hit or miss may be determined based on a comparison of the Hamming distance against a threshold. A Hamming distance is essentially the number of different bits observed between a pair of equal sized data structures. For instance, the Hamming distance between words 0011001 and 1010100 is 4.

A minimal Hamming distance is a function of the error detection/correction code. In particular, viewing a tag+ECC data structure as a codeword, the minimal Hamming distance is the smallest difference in the number of bits between any two different and valid tag+ECC codewords (here, on account of the ECC component, even if the tag component is permitted to be random, it is understood that there are valid tag+ECC codewords and invalid tag+ECC codewords). For instance, if a particular error detection/correction code is characterized as having a minimal Hamming distance of 4, then, any two different and valid tag+ECC data structures will have at least 4 different bits between them when the two data structures are compared.

A property of such error detection/correction codes is that, if the minimal Hamming distance is defined to be $d_m$, then, the code can be used to detect up to ceiling$((d_m-1)/2)$ errors in any particular codeword and correct up to floor$((d_m-1)/2)$ errors in any particular codeword. For example, a code having a minimal Hamming distance=$d_m$=4 can detect up to 2 errors in any codeword and correct up to 1 error in any codeword.

In an embodiment, a cache hit circuit may operate as follows: if the Hamming distance between a cached tag+ECC data structure and a search tag+ECC data structure is calculated to be less than or equal to floor$((d_m-1)/2)$, then, the two data structures may be deemed to match. Said another way, if a comparison between two codewords yields a result that is less than or equal to the ability of the code to correct an error within any particular codeword, then, the two codewords may be determined as the same. Determining a cache hit in such a way avoids the need for error detection and correction of the tag values read from cache and therefore improves performance as compared to the circuit of FIG. 3.

In an embodiment, a pair of cached tag values 401.1, 401.2 and their respective ECC values 402.1, 402.2 may be read from the cache substantially simultaneously. An ECC 405 value may be generated for the search tag 404 by ECC generation circuitry 406. In an embodiment, the ECC 405 for the search tag 404 may be generated by the ECC generation circuitry 406 substantially in parallel (or at least with some overlap in time) with the reading of the cached tags and their respective ECCs from the cache 400. The data structure comprised of the search tag 404 and its ECC 405 may then be compared by bitwise comparison circuits 407, 408 against both of the data structures comprised respectively of one of the cached tags 401.1/401.2 and its respective ECC 402.1/402.2. The comparison circuits may be implemented with some form of XOR gate to perform the bitwise comparison of the pair of input data structures.

Summation circuits 409, 410 may add the number of bits that are different in each respective comparison. Recalling that a Hamming distance corresponds to the number of different bits between two codewords, the output of summation circuits 409, 410 may correspond to the respective Hamming distance between the search tag 404 and its ECC value 405 and one of the cached tags 401.1/401.2 and its ECC value

402.1/402.2. Recalling that an underlying philosophy of the search is that a match can be presumed if the Hamming distance between these comparisons is less than or equal to floor(($d_m$−1)/2). As such, threshold comparison circuits 411, 412 may receive the respective summation values from summation circuits 409, 410 to determine if the respective summations reach a necessary threshold. For instance, in the case of $d_m$=4, threshold comparison circuits 411, 412 may determine if a summation is less than or equal to a threshold value of 1. If the appropriate threshold is reached, a threshold comparison circuit may raise a match flag (hit) at its output. In an embodiment, if the appropriate threshold is not reached, the comparison circuit may not raise a match flag at its output, and the processor may determine that a cache miss occurred.

Although FIG. 4 shows processing for a pair of cache tags and their respective ECCs, a person having ordinary skill in the art will appreciate that the architecture of FIG. 4 may be readily extended to process more than two cache tags and their ECCs at a time for a single search tag. Similarly, the architecture of FIG. 4 may be reduced to only process a single cache tag and its ECC at a time. Furthermore, although the circuit of FIG. 4 is understood to be instantiated for a single set within a cache, such a circuit may be instantiated multiple times (e.g., one such circuit for each set of a cache).

Figure 5:
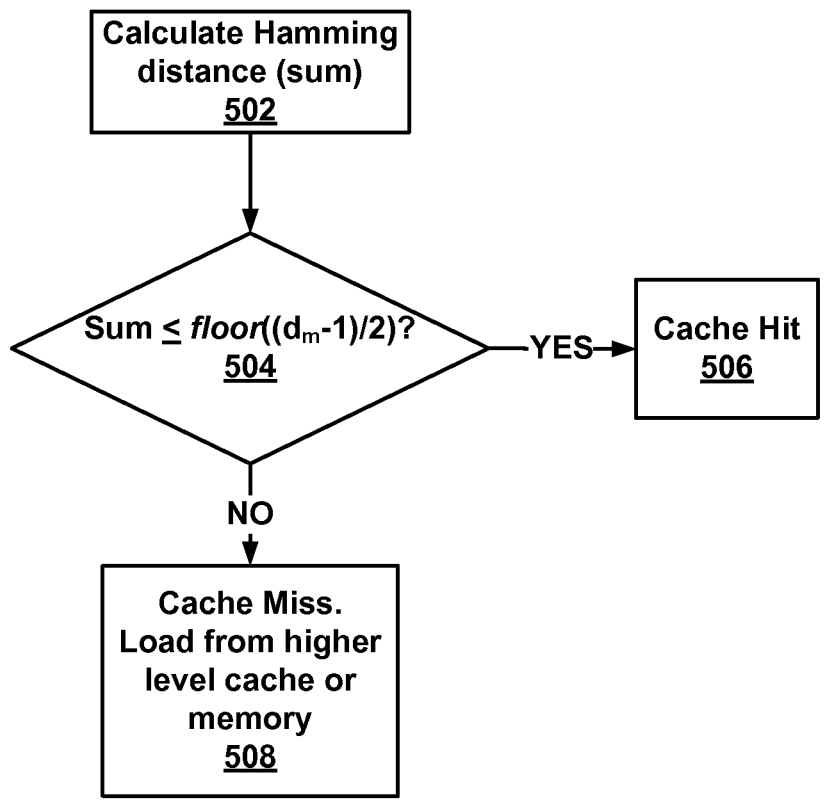
FIG. 5 illustrates a method to access data based on Hamming distance according to an embodiment.

FIG. 5 illustrates a method 500 to access data based on the Hamming distance according to an embodiment. As explained above, the Hamming distance (sum) between a cached tag+ECC data structure and a search tag+ECC data structure may be calculated 502. If the Hamming distance is less than or equal to floor(($d_m$−1)/2) (step 504), a cache hit may be signaled 506 and the data entry in the cache which corresponds to the cached tag may be retrieved. Otherwise, a cache miss may be signaled and the requested data may be retrieved from memory (or a higher level cache) 508.

For example, if the minimum Hamming distance ($d_m$)=4, then floor(($d_m$−1)/2) is 1. The Hamming distance (sum) between the cached tag+ECC data structure and the search tag+ECC data structure may be calculated 502. If the Hamming distance is less than or equal to 1 (i.e., 0 or 1), a cache hit is signaled and the data entry in the cache which corresponds to the cached tag may be retrieved. Otherwise, a cache miss may be signaled and the requested data may be retrieved from memory (or a higher level cache) 508.

In certain circumstances, the method 500 may signal a cache miss if the requested data is in the cache but the corresponding cached tag has errors above a threshold. Specifically, the Hamming distance between the cached tag+ECC data structure and the search tag+ECC data structure may be greater than floor(($d_m$−1)/2) in situations where the cached tag includes errors which are detectable but not correctable. For example, if the minimum Hamming distance ($d_m$)=4, and the cached tag has a double error, the Hamming distance between the cached tag+ECC data structure and the search tag+ECC data structure will be two or higher. However, since a double error in the cached tag is not correctable, in an embodiment, the method 500 may signal a cache miss.

As a result of a cache miss, the requested data may be loaded from memory or a higher level cache. The cache entry (with the double error in the corresponding cached tag) which is about to be replaced may currently be in a modified (dirty) state or a non-modified (clean) state. If the cache entry is currently in a non-modified state, there is no problem in replacing the data since the data in memory and the current data in cache will be the same. However, if the cache entry is currently in a modified state, the data which is loaded from memory may be stale.

To address the above issue, in an embodiment, error detection/correction may be performed during eviction of data from the cache to memory or a higher level cache. For example, a cache entry in a modified state (with a double error in the corresponding cached tag) may be replaced by stale data from memory. The cache entry may eventually be evicted based on a cache eviction algorithm. To evict the cache entry, in an embodiment, error detection/correction may be performed on the cached tag corresponding to the cache entry in order to determine the associated memory address. In an embodiment, if an uncorrectable error is detected in the cached tag, the system may signal an error to the hardware and/or software.

Figure 6:
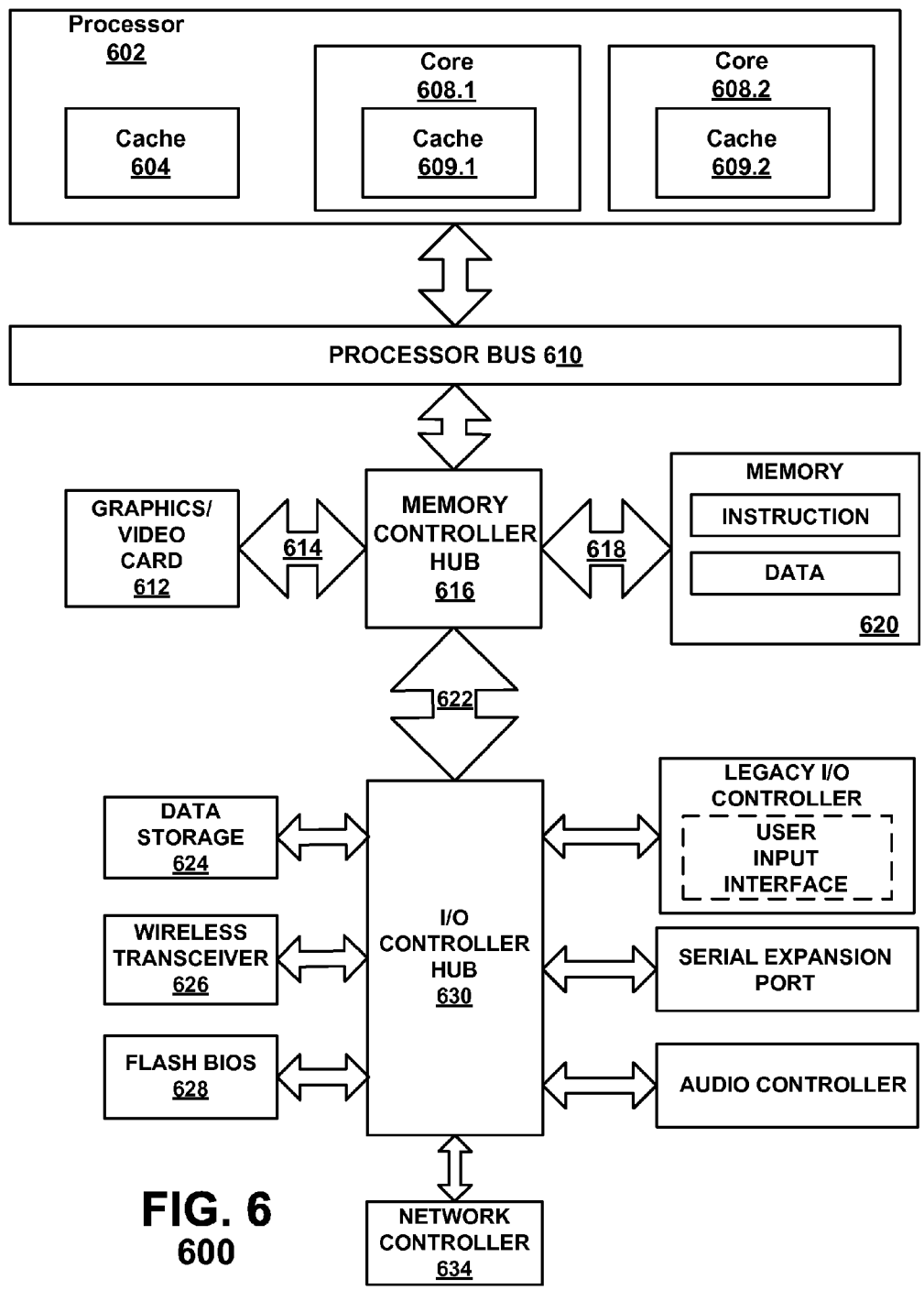
FIG. 6 is a block diagram of an exemplary computer system according to an embodiment.

FIG. 6 is a block diagram of an exemplary computer system 600 formed with a processor 602 that includes one or more cores 608 (e.g., cores 608.1 and 608.2). Each core 608 may execute an instruction in accordance with one embodiment of the present invention. System 600 includes a component, such as a processor 602 to employ execution units including logic to perform algorithms for process data, in accordance with the present invention. System 600 is representative of processing systems based on the PENTIUM® III, PENTIUM® 4, Xeon™, Itanium®, XScale™ and/or StrongARM™ microprocessors available from Intel Corporation of Santa Clara, Calif., although other systems (including PCs having other microprocessors, engineering workstations, set-top boxes and the like) may also be used. In one embodiment, sample system 600 may execute a version of the WINDOWS™ operating system available from Microsoft Corporation of Redmond, Wash., although other operating systems (UNIX and Linux for example), embedded software, and/or graphical user interfaces, may also be used. Thus, embodiments of the present invention are not limited to any specific combination of hardware circuitry and software.

Embodiments are not limited to computer systems. Alternative embodiments of the present invention can be used in other devices such as handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other system that can perform one or more instructions in accordance with at least one embodiment.

One embodiment of the system 600 may be described in the context of a single processor desktop or server system, but alternative embodiments can be included in a multiprocessor system. System 600 may be an example of a 'hub' system architecture. The computer system 600 includes a processor 602 to process data signals. The processor 602 can be a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 602 is coupled to a processor bus 610 that can transmit data signals between the processor 602 and other components in the system 600. The elements of system 600 perform their conventional functions that are well known to those familiar with the art.

Depending on the architecture, the processor 602 can have a single internal cache or multiple levels of internal cache. Alternatively, in another embodiment, the cache memory can reside external to the processor 602. Other embodiments can also include a combination of both internal and external caches depending on the particular implementation and needs. In one embodiment, the processor 602 may include a Level 2 (L2) internal cache memory 604 and each core (e.g., 608.1 and 608.2) may include a Level 1 (L1) cache (e.g., 609.1 and 609.2, respectively). In one embodiment, the processor 602 may be implemented in one or more semiconductor chips. When implemented in one chip, all or some of the processor 602's components may be integrated in one semiconductor die.

Each of the core 608.1 and 608.2 may also include respective register files (not shown) that can store different types of data in various registers including integer registers, floating point registers, status registers, and instruction pointer register. Each core 608 may further include logic to perform integer and floating point operations.

The processor 602 also includes a microcode (ucode) ROM that stores microcode for certain macroinstructions. For one embodiment, each core 608 may include logic to handle a packed instruction set (not shown). By including the packed instruction set in the instruction set of a general-purpose processor 602, along with associated circuitry to execute the instructions, the operations used by many multimedia applications may be performed using packed data in a general-purpose processor 602. Thus, many multimedia applications can be accelerated and executed more efficiently by using the full width of a processor's data bus for performing operations on packed data. This can eliminate the need to transfer smaller units of data across the processor's data bus to perform one or more operations one data element at a time.

Alternate embodiments of the processor 602 can also be used in micro controllers, embedded processors, graphics devices, DSPs, and other types of logic circuits. System 600 includes a memory 620. Memory 620 can be a dynamic random access memory (DRAM) device, a static random access memory (SRAM) device, flash memory device, or other memory device. Memory 620 can store instructions and/or data represented by data signals that can be executed by the processor 602.

A system logic chip 616 is coupled to the processor bus 610 and memory 620. The system logic chip 616 in the illustrated embodiment is a memory controller hub (MCH). The processor 602 can communicate to the MCH 616 via a processor bus 610. The MCH 616 provides a high bandwidth memory path 618 to memory 620 for instruction and data storage and for storage of graphics commands, data and textures. The MCH 616 is to direct data signals between the processor 602, memory 620, and other components in the system 600 and to bridge the data signals between processor bus 610, memory 620, and system I/O 622. In some embodiments, the system logic chip 616 can provide a graphics port for coupling to a graphics controller 612. The MCH 616 is coupled to memory 620 through a memory interface 618. The graphics card 612 may be coupled to the MCH 616 through an Accelerated Graphics Port (AGP) interconnect 614.

System 600 uses a proprietary hub interface bus 622 to couple the MCH 616 to the I/O controller hub (ICH) 630. The ICH 630 provides direct connections to some I/O devices via a local I/O bus. The local I/O bus is a high-speed I/O bus for connecting peripherals to the memory 620, chipset, and processor 602. Some examples are the audio controller, firmware hub (flash BIOS) 628, wireless transceiver 626, data storage 624, legacy I/O controller containing user input and keyboard interfaces, a serial expansion port such as Universal Serial Bus (USB), and a network controller 634. The data storage device 624 can comprise a hard disk drive, a floppy disk drive, a CD-ROM device, a flash memory device, or other mass storage device.

For another embodiment of a system, an instruction in accordance with one embodiment can be used with a system on a chip. One embodiment of a system on a chip comprises of a processor and a memory. The memory for one such system is a flash memory. The flash memory can be located on the same die as the processor and other system components. Additionally, other logic blocks such as a memory controller or graphics controller can also be located on a system on a chip.

A value, as used herein, includes any known representation of a number, a state, a logical state, or a binary logical state. Often, the use of logic levels, logic values, or logical values is also referred to as 1s and 0s, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

The embodiments of methods, hardware, software, firmware or code set forth above may be implemented via instructions or code stored on a machine-accessible or machine readable medium which are executable by a processing element. A machine-accessible/readable medium includes any mechanism that provides (i.e., stores and/or transmits) information in a form readable by a machine, such as a computer or electronic system. For example, a machine-accessible medium includes random-access memory (RAM), such as static RAM (SRAM) or dynamic RAM (DRAM); ROM; magnetic or optical storage medium; flash memory devices; electrical storage device, optical storage devices, acoustical storage devices or other form of propagated signal (e.g., carrier waves, infrared signals, digital signals) storage device; etc. For example, a machine may access a storage device through receiving a propagated signal, such as a carrier wave, from a medium capable of holding the information to be transmitted on the propagated signal.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A method comprising:
   constructing a first codeword from a cache tag in a cache and an error correction code corresponding to the cache tag;

constructing a second codeword from a search tag and an error correction code corresponding to the search tag;

calculating a hamming distance between the first codeword and the second codeword;

if the hamming distance is one of less than and equal to a threshold, signaling a cache hit; and if the hamming distance is above the threshold, signaling a cache miss.

2. The method of claim 1, wherein the threshold is calculated from a minimum hamming distance.

3. The method of claim 2, wherein the minimum hamming distance is four and the threshold is two.

4. The method of claim 1, further comprising:
responsive to a cache hit, accessing a cache entry corresponding to the search tag from the cache.

5. The method of claim 1, further comprising:
responsive to a cache miss, loading a cache entry corresponding to the search tag from one of a higher level cache and memory.

6. The method of claim 1, further comprising:
responsive to eviction of a cache entry corresponding to the cache tag, detecting at least one error in the cache tag; and if the detected at least one error is not correctable, signaling an error condition.

7. The method of claim 6, wherein the cache entry is in a modified state.

8. An apparatus comprising:
a processor to execute computer instructions, wherein the processor is configured to:
construct a first codeword from a cache tag in a cache and an error correction code corresponding to the cache tag;
construct a second codeword from a search tag and an error correction code corresponding to the search tag;
calculate a hamming distance between the first codeword and the second codeword;
if the hamming distance is one of less than and equal to a threshold, signal a cache hit; and
if the hamming distance is above the threshold, signal a cache miss.

9. The apparatus of claim 8, wherein the threshold is calculated from a minimum hamming distance.

10. The apparatus of claim 9, wherein the minimum hamming distance is four and the threshold is two.

11. The apparatus of claim 8, wherein the processor is further configured to:
responsive to a cache hit, access a cache entry corresponding to the search tag from the cache.

12. The apparatus of claim 8, wherein the processor is further configured to:
responsive to a cache miss, load a cache entry corresponding to the search tag from one of a higher level cache and memory.

13. The apparatus of claim 8, wherein the processor is further configured to:
responsive to eviction of a cache entry corresponding to the cache tag, detect at least one error in the cache tag; and
if the detected at least one error is not correctable, signal an error condition.

14. The apparatus of claim 13, wherein the cache entry is in a modified state.

15. A non-transitory machine-readable medium having stored thereon an instruction, which if performed by a machine causes the machine to perform a method comprising:
constructing a first codeword from a cache tag in a cache and an error correction code corresponding to the cache tag;
constructing a second codeword from a search tag and an error correction code corresponding to the search tag;
calculating a hamming distance between the first codeword and the second codeword;
if the hamming distance is one of less than and equal to a threshold, signaling a cache hit; and
if the hamming distance is above the threshold, signaling a cache miss.

16. The machine-readable medium of claim 15, wherein the threshold is calculated from a minimum hamming distance.

17. The machine-readable medium of claim 16, wherein the minimum hamming distance is four and the threshold is two.

18. The machine-readable medium of claim 15, the method further comprising:
responsive to a cache miss, loading a cache entry corresponding to the search tag from one of a higher level cache and memory.

19. The machine-readable medium of claim 15, the method further comprising:
responsive to eviction of a cache entry corresponding to the cache tag, detecting at least one error in the cache tag; and
if the detected at least one error is not correctable, signaling an error condition.

20. The machine-readable medium of claim 19, wherein the cache entry is in a modified state.

* * * * *